United States Patent [19]

Schmitt et al.

[11] Patent Number: 4,821,413
[45] Date of Patent: Apr. 18, 1989

[54] METHOD OF MAKING ELECTRIC COMPONENT

[75] Inventors: Herbert Schmitt; Dietrich Krause; Helmut Winkler, all of Bad Neustadt, Fed. Rep. of Germany

[73] Assignee: Preh Elektrofeinmechanische Werke Jakob Preh Nachf. GmbH & Co., Bad Neustadt/Saale, Fed. Rep. of Germany

[21] Appl. No.: 35,520

[22] Filed: Apr. 7, 1987

[30] Foreign Application Priority Data

Apr. 15, 1986 [DE] Fed. Rep. of Germany ....... 3612576

[51] Int. Cl.4 ............................................. H01R 43/00
[52] U.S. Cl. ........................................ 29/883; 29/884;
264/272.11; 264/272.15
[58] Field of Search ........................... 29/882, 883, 884;
264/272.11, 272.15

[56] References Cited

U.S. PATENT DOCUMENTS

| 1,161,191 | 11/1915 | Cook | 29/884 X |
| 3,618,207 | 11/1971 | Sand et al. | 29/883 X |
| 3,798,763 | 3/1974 | Deltoer | 29/883 X |
| 4,090,293 | 5/1978 | Van der Donk et al. | 29/883 |
| 4,197,636 | 4/1980 | Osanai | 29/882 |
| 4,388,757 | 6/1983 | Takeyama et al. | 29/882 |

FOREIGN PATENT DOCUMENTS 2156711 10/1985 United Kingdom ................. 29/883

Primary Examiner—Carl J. Arbes
Attorney, Agent, or Firm—Woodcock Washburn Kurtz Mackiewicz & Norris

[57] ABSTRACT

In an electric component a plastic sheath encloses conductive connections and leaves their terminal ends exposed. In order to keep the conductive connections at specific distances to the plastic sheath and to guarantee that the conductive connections are not exposed at the plastic sheath in intermediate areas, the conductive connections are secured together in spaced relation by a plastic carrier surrounding the conductive connections at spaced regions along their length. The plastic carrier has pins projecting therefrom which have end surfaces which serve to space the conductive connections a true distance from the surface of a mould in which a plastic sheath is moulded around the conductive connections and the plastic carrier. The plastic carrier and the conductive connections are encapsulated with the plastic sheath with the pins properly positioning the conductive carriers within the plastic sheath without forming any undesired openings in the plastic sheath.

4 Claims, 3 Drawing Sheets

METHOD OF MAKING ELECTRIC COMPONENT

FIELD OF THE INVENTION

The present invention relates to an electric component having conductive connections and terminal ends as well as a plastic sheath encapsulating said conductive connections and leaving the terminal ends exposed.

BACKGROUND OF THE INVENTION

In West German Patent Specification No. DE-PS 27 25 796 an electric socket is described, comprising male contacts enclosed in a housing of thermoplastic material. A socket of this kind must be tightly enclosed in order to avoid environmental influences which can adversely affect the electric conductors.

If conductive connections are encapsulated in a plastic sheath by injection moulding, the essential thing is, particularly in the case of long, mechanically flexible, flat or short-distanced conductive connections, to take measures which guarantee that the terminal ends will be arranged within close tolerance limits in their predetermined positions, and that the conductive connections themselves will be embedded in the plastic sheath in their desired positions. According to the prior art, positioning pins are provided for that purpose in the injection mould, pressing, for example, on the conductive connections and holding these in a desired position in the mould. After the plastic sheath has been injection moulded around the conductive connections, they are exposed at the point where the pins had been pressing on the conductive connections. At these points, environmental influences can act on the conductive connections. In the course of time, the conductive connections may suffer damages, particularly when the component is being used, such as in the engine space of a motor vehicle where there is a damaging atmosphere. It would be very labour-intensive and costly to subsequently close each of the exposed parts of the conductive connections separately. Apart from that, the success of this measure would be dubious, since these parts tend to be small.

SUMMARY OF THE INVENTION

It is a purpose of the present invention to provide a component of the above-described type, the conductive connections of which, on the one hand, are at a certain distance from the plastic sheath and, on the other hand, are not exposed through the sheath in intermediate areas, so that the sheath in intermediate areas do not have to be subsequently closed.

According to the present invention, the above purposes are fulfilled in a component of the above-described type by fixing the spacing between the conductive connections by a carrier of plastic material surrounding the conductive connections at spaced regions along their lengths, which plastic carrier forms at least several distance surfaces being true-to-size with respect to the position of the conductive connections, and by covering the plastic carrier and the conductive connections with the plastic sheath.

On the one hand, the conductive connections are kept in position in their mutual spacing by the plastic carrier. On the other hand, the distance surfaces are positioned true-to-size with respect to the conductive connections. By that, spacer pins of the mould in which the plastic sheath is applied, may protrude from these distance surfaces. After the plastic sheath has been molded, the conductive connections are not exposed in the area of the spacer pins, since there they are covered by the plastic carrier, in particular by its distance surfaces. After the plastic sheath has been applied, further process steps for covering the conductive connections at any exposed position is unnecessary.

In the preferred embodiment of the present invention, stop faces are formed on pins formed on the plastic carrier for positioning the conductive connections and the terminal ends in the electric component. Spacer pins in the mould in which the plastic sheath is applied are then unnecessary.

A further advantage of the present invention is that the conductive connections are formed as a frame which can be punched out of a sheet of conductive material. The frame is embedded in the plastic sheath. By that it is possible to arrange a plurality of conductive connections in the plastic sheath, which serve for connection switching elements, which switching elements are mounted only after the component has been produced.

The method according to the invention for the production of a component is characterized by regionally surrounding a frame of the conductive connections connected together by connecting bars by injection-moulding with a plastic carrier so that the conductive connections are fixed at their predetermined spacing. Thereafter, the connecting bars of the frame existing between the conductive connections are separated. Then the frame or a plurality of frames are put into a mould, with the distance surfaces keeping the necessary distance between the plastic carrier and the mould. The frame or frames and their plastic carriers are then encapsulated with the plastic sheath by injection-moulding.

Other advantages and embodiments of the present invention will appear or be suggested from the following description of an example of an embodiment and the claims and the accompanying drawings.

DETAILED DESCRIPTION OF THE INVENTION

Figure 1:
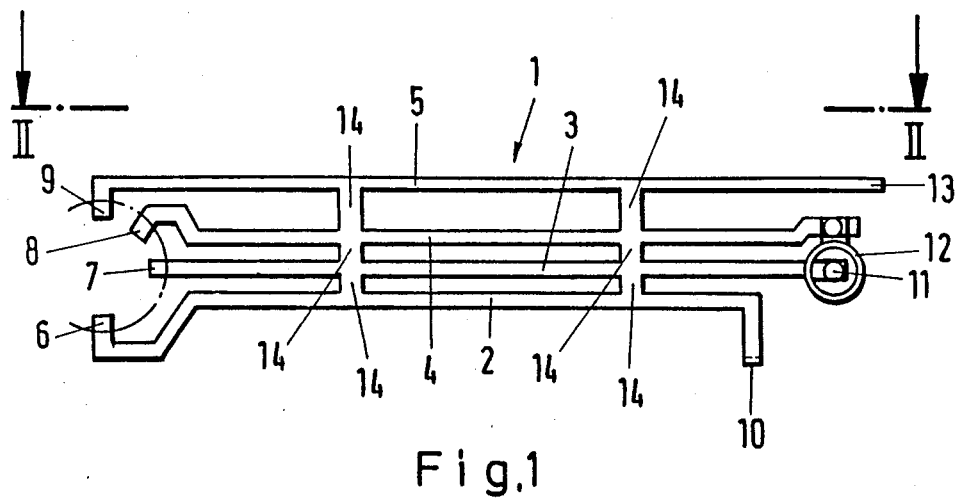
FIG. 1 is top view of a terminal frame forming conductive connections and terminal ends connected together.
Figure 2:
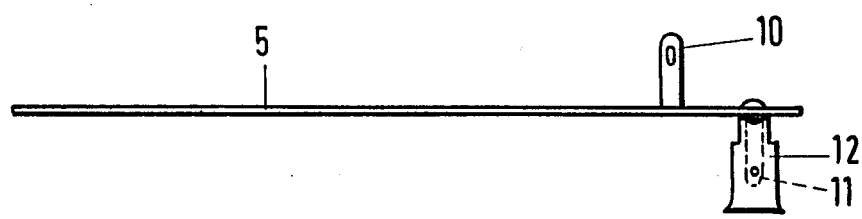
FIG. 2 is a view of the terminal frame in the direction of line II—II according to FIG. 1.

A terminal frame 1 of an electrically conductive metal includes four conductive connections 2, 3, 4, 5, at the ends of which are terminal ends 6, 7, 8, 9 and 10, 11, 12, 13, respectively. The terminal ends 6, 7, 8, 9 are arranged in a circle. The terminal end 12 is in the form of a sleeve which is attached at the end of the conductive connection 4. In the sleeve 12 is a pin-shaped terminal end 11 which is attached to the end of the conductive connection 3. The terminal end 10 is formed as a solder contact for a conductor, and is bent off from the plane of the conductive connections. The conductive connections and the terminal ends are shaped in accordance with the particular need and use of the component.

The conductive connections 2, 3, 4, 5 are connected by connecting bars 14 so that the terminal frame forms a unified unit. The terminal frame 1 may be formed by punching it from a sheet of the conductive metal.

The described terminal frame 1 is surrounded by injection-moulding with a carrier 15 of plastic material (see FIG. 3) at several spaced regions along its length out of the range of the connecting bars 14. In the case of the example, the plastic carrier 15 has three separate sections 16, 17, 18. In the region 19, the section 16 surrounds all of the four conductive connections 2, 3, 4, 5 and fixes their distance apart. In a region 20, the section 16 of the plastic carrier 15 is placed only on one side of the terminal ends 6, 7, 8, 9, so that these are exposed at the top (see FIG. 4). In the region 20, pins 21 are formed on and project from the section 16. The exposed ends of the pins 21 form surfaces 22 spaced from the section 16.

In section 17, the plastic carrier 15 surrounds all of the four conductive connections 2, 3, 4, 5 at spaced areas 23 and 24. In between the areas 23 and 24, area 25 of the section 17 extend only along one side of the conductive connections 2, 3, 4, 5. On the one side 26 opposed to the area 25, the conductive connections 2, 3, 4, 5 are not covered by the plastic carrier 15 and are exposed. At the areas 23, 24, 25 pins 27 are formed on and project from the section 17. The exposed ends of the pins 27 form stop faces 28 (see FIG. 4).

The section 18 embraces the conductive connections 2, 3, 4, 5 spaced from the terminal ends 10, 11, 12, 13. The section 18 maintains the necessary distance between the conductive connections 2, 3, 4, 5 in the area of the terminal ends 10, 11, 12, 13. Since the conductive connections 2, 3, 4, 5 are connected together at a number of places along their lengths, they may be made of a soft and easily bendable material, which is advantageously suited for the bonding of electrical components.

Figure 3:
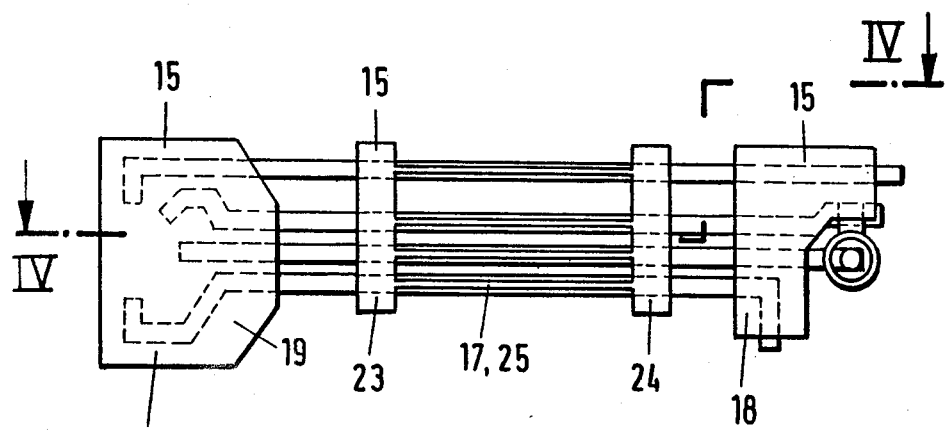
FIG. 3 is a top view of the terminal frame surrounded by injection-moulding with a plastic carrier.
Figure 4:
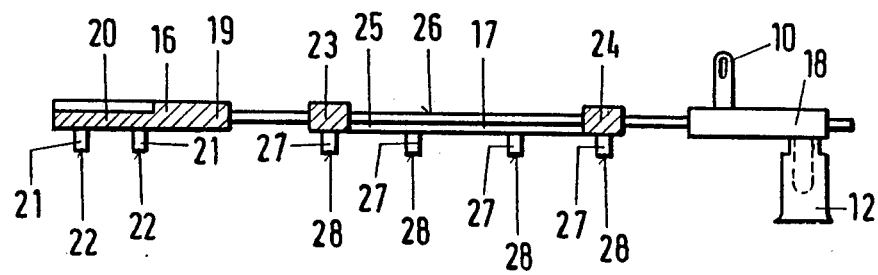
FIG. 4 is a side view, partially sectioned, along the line IV—IV of the terminal frame according to FIG. 3.

Upon curing of the sections 16 to 18 of the plastic carrier 15, the connecting bars 14 are cut through (compare FIG. 1 with FIG. 3). Thus, the conductive connections 2, 3, 4, 5 are electrically disconnected, although they are still mechanically connected together in the right positions by means of the sections 16 to 18 of the plastic carrier 15.

Figure 5:
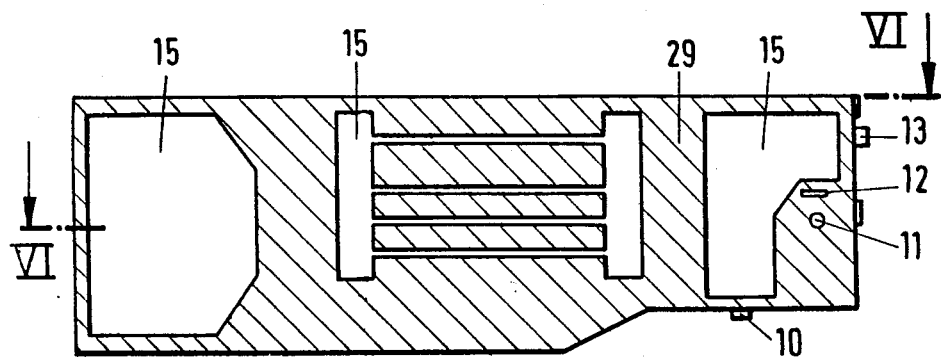
FIG. 5 is a transverse sectional view along the line V—V according to FIG. 6 of the terminal frame surrounded by injection-moulding with the plastic carrier and a plastic sheath.
Figure 6:
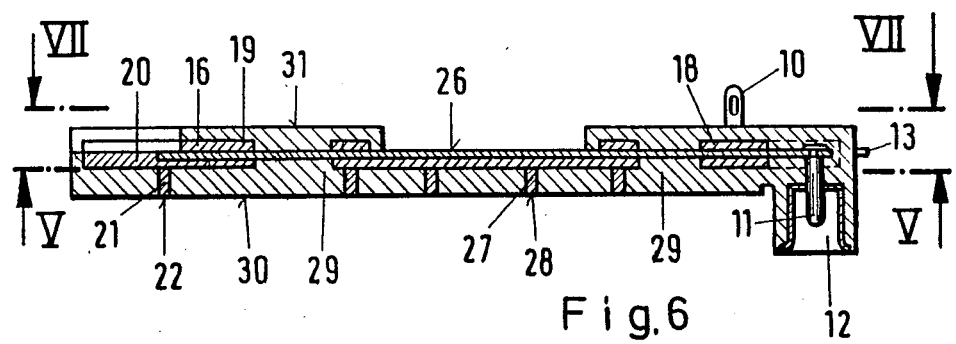
FIG. 6 is a sectional view along the line VI—VI according to FIG. 5 of the encapsulated terminal frame.
Figure 7:
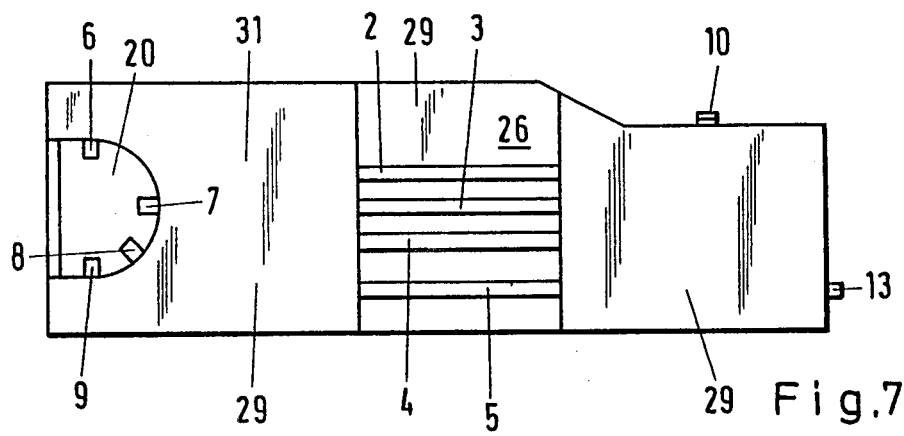
FIG. 7 is a top view along the line VII—VII according to FIG. 6 of the component ready for connection.

The basic unit thus created is then put into a mould. The end surfaces 22 and 28 of the pins 21 and 27 thereby protrude from the one side of the unit and seat against the mould so as to guarantee the necessary distance between the mould and the conductive connections 2, 3, 4, 5. A plastic material is then injected into the mould, which forms the plastic sheath 29. On the bottom side 30, the plastic sheath 29 continuously extends over the terminal ends 6, 7, 8, 9 and the conductive connections 2, 3, 4, 5, around the pins 21, 27 up to the terminal ends 10, 11, 12, 13 (see FIG. 5). On the upper side 31, the plastic sheath 29 leaves the terminal ends 6, 7, 8, 9 exposed. Moreover, in the case of the example, it leaves the conductive connections 2, 3, 4, 5 exposed in the region between the areas 23 and 24 (see 26 in FIG. 6). Electrical components can then be connected in this region to the conductive connections 2, 3, 4, 5. Should this be unnecessary, the plastic sheath 29 could be continuously extended on the upper side 31 between the terminal ends 6, 7, 8, 9 and the terminal ends 10, 11, 12, 13.

In the component described, the conductive connections 2, 3, 4, 5 are exposed at those points only where necessary for their electric connection. The conductive connections 2, 3, 4, 5 are not exposed at those points which, in the production process, serve for keeping the necessary distance between the surface of the plastic sheath 29 and the conductive connections 2, 3, 4, 5. They are tightly encapsulated in the area of the pins 21, 27 provided for creating the spacing between the plastic carrier 15 and the mould. The pins 21, 27 make pins of the mould unnecessary. However, pins may be provided in the mould as well, which would then protrude from the sections 16, 17, 18. In this case, too, the conductive connections 2, 3, 4, 5 would be covered and protected from the environment by the sections 16, 17, 18 at the finished component.

The same plastic materials can be used as material for the plastic carrier 15 as well as for the plastic sheath 29. However, it is also possible to use another plastic material for the plastic carrier 15 than for the plastic sheath 29. For example, the plastic carrier 15, particularly its section 17, could be made of an electrically high resistance plastic material, the specific electrical resistance of which is of lower resistance than that of the plastic sheath 29. In that way, capacitive coupling effects between the conductive connections 2, 3, 4, 5 can be avoided.

It is also possible to make the plastic carrier 15 of a light guiding material and to arrange the plastic carrier 15 continuously between the terminal ends 6 or 7 or 8 or 9, respectively, and the terminal ends 10 or 11 or 12 or 13, respectively. An optical coupling between the terminal ends can then be achieved. An optical coupling between the zone between the areas 23 and 24 and the terminal ends can be created as well.

In a lot of cases, however, it will be sufficient to use an inexpensive plastic material, such as a polypropylene, for example for the plastic carrier 15 and to produce only the plastic sheath 29 of a more expensive plastic material having specific characteristics such as, for example, the characteristic of being resistance against high temperatures and/or chemicals, and having a high impact strength.

We claim:

1. A method of making a component characterized by forming a terminal frame having conductive connections with terminal ends and connecting bars connecting the conductive connections in a predetermined spaced relation, moulding a plastic carrier around at least a first portion of the conductive connections out of the range of the connecting bars to fix the predetermined spacing, then cutting the connecting bars to electrically separate the conductive connections, and then moulding a plastic sheath around at least a second portion of the conductive connections and the plastic carrier while maintaining said predetermined spaced relation.

2. A method according to claim 1 characterized in that the plastic carrier is moulded around the conductive connections at spaced points along the length of the conductive connections.

3. A method according to claim 2 characterized in that the plastic carrier is moulded with pins projecting therefrom which have surfaces which engage the surface of the mould when the plastic sheath is moulded around the conductive connections and plastic carrier to position the conductive connections with the plastic sheath.

4. A method of making a component provided by a terminal frame having a plurality of conductive connections, each said conductive connection including a pair of terminal ends, said terminal frame further having means for connecting said conductive connections between their terminal ends in fixed spaced relation, comprising the steps of:

providing a first plastic material of a known electrical resistance;

moulding a carrier of said first plastic material around at least a first portion of said terminal frame proximate to said connecting means to further fix the spacing between said conductive connections, said carrier including a pair of opposed surfaces with one or more spacers projecting outwardly from one said surface;

disconnecting said connecting means from said conductive connections to electrically separate said conductive connections one from the other;

providing a second plastic material which has an electrical resistance that is higher than said known electrical resistance; and moulding a sheath of said second plastic material around at least a second portion of said conductive connections and said carrier while maintaining said fixed spaced relation, said sheath also including a pair of opposed surfaces one of which is coplanar with an outer end of each said spacer, and the other of which includes an opening to expose each said conductive connection along a third portion thereof between said terminal ends, said terminal ends projecting from said sheath.

* * * * *